(12) United States Patent
Kim

(10) Patent No.: US 6,973,007 B2
(45) Date of Patent: Dec. 6, 2005

(54) MAIN ROW DECODER IN A SEMICONDUCTOR MEMORY DEVICE

(75) Inventor: Sam Soo Kim, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/878,903

(22) Filed: Jun. 28, 2004

(65) Prior Publication Data

US 2005/0141326 A1   Jun. 30, 2005

(30) Foreign Application Priority Data

Dec. 30, 2003   (KR) ............... 10-2003-0100161

(51) Int. Cl.$^7$ .............................. G11C 8/00
(52) U.S. Cl. .................... 365/230.06; 365/189.08; 365/222; 365/230.08
(58) Field of Search .............. 365/230.06, 230.08, 365/222, 193, 203, 189.08, 233

(56) References Cited

U.S. PATENT DOCUMENTS

| | | | | |
|---|---|---|---|---|
| 5,940,342 A | * | 8/1999 | Yamazaki et al. | 365/230.03 |
| 6,212,126 B1 | * | 4/2001 | Sakamoto | 365/233 |
| 6,373,783 B1 | * | 4/2002 | Tomita | 365/233 |
| 6,507,526 B2 | * | 1/2003 | Ohtake | 365/203 |
| 6,674,684 B1 | * | 1/2004 | Shen | 365/230.03 |

* cited by examiner

*Primary Examiner*—Son T. Dinh
(74) *Attorney, Agent, or Firm*—Marshall, Gerstein & Borun LLP

(57) ABSTRACT

The disclosure is a main row decoder of a semiconductor memory device including: a bank controller for generating an internal RAS signal in response to an active and precharge signal; a first pulse generator for generating a first pulse signal when the internal RAS signal transitions; a second pulse generator for generating a second pulse signal when the internal RAS signal or a self refresh signal transitions; an address latch circuit for latching the least significant bit of a row address in response to the first pulse signal; and a row pre-decoder for decoding outputs of the address latch circuit in response to the second pulse signal.

8 Claims, 6 Drawing Sheets

MAIN ROW DECODER IN A SEMICONDUCTOR MEMORY DEVICE

FIELD OF THE INVENTION

The present invention relates to a main row decoder and specifically, to a main row decoder of a semiconductor memory device without resuming active and precharge operations of a main word line when an address corresponding to a sub word line connected to the main word line is selected.

BACKGROUND OF THE INVENTION

FIG. 1 is a schematic diagram illustrating a hierarchical word line structure of a conventional art.

A main word line is associated with four or eight sub word lines. The main word line MWLB is enabled by an output of a main word line driver 100. The sub word line SWL is enabled by a sub word line driver 400 driven by the main word line driver 100 and PX drivers 200 and 210. The sub word line driver SW is coupled to gates of a multiplicity of cells. If the sub word line is selected and a bit line is selected, data is output by way of a bit line sense amplifier 300.

FIG. 2 is a circuit diagram of a main word line driver shown in FIG. 1.

When a word line enable signal WLE is a low level, a transistor Q1 is turned on to make a node k1 be a high level. As an output of inverter I1 is a low level, a transistor Q5 is turned on to latch a potential of the node k1. Here, as an output of an inverter I2 is a high level, the main word line MWLB is disabled.

When the word line enable signal WLE is a high level and a coding signal of a bank selection address (e.g., Bax34 and Bax56) is a high level, the transistors Q2 to Q4 are turned on to make a potential of the node k1 be a low level. Therefore, an output of an inverter I2 becomes a low level and thereby the main word line MWLB is enabled. If the main word line MWLB is enabled with a low level, a transistor Q6 of the sub word line driver shown in FIG. 3 is turned on and then the sub word line SWL is enabled with a high level by a word line drive signal PX. If the main word line MWLB is a high level, a transistor Q7 is turned on to disable the sub word line SWL a low level. The word line drive signal PX applied to a gate of a transistor Q8 is used for preventing a deselected sub word line driver from being floated when one sub word line driver is selected.

FIG. 4 is a block diagram of a conventional main row decoder.

An address <0:n> is applied to a row address buffer 10. An internal RAS (Row Address Strobe) signal iRAS_D is generated from a bank controller 40 in response to an active signal ACT and a precharge signal PCG. An output of the row address buffer 10 is latched in an address latch circuit 20 by the internal RAS signal IRAS_D. An output of the address latch circuit 20 is pre-decoded in a row pre-decoder 30 by control of the internal RAS signal IRAS_D.

An output of the row pre-decoder 30 enables the main word line MWLB.

FIG. 5 is a circuit diagram of an address latch circuit shown in FIG. 4.

An output signal at_row of the row address buffer 10 is inverted by an inverter I5. The internal RAS signal iRAS_D is inverted by an inverter I3 and an output of the inverter I3 is inverted by an inverter I4. The detail circuits of inverters I7 and I8 are disclosed in the square boxes. The inverters I7 and I8 act as inverters to invert their input signals when an enable signal EN is a high level and a complementary enable signal ENB is a low level. An output of an inverter I5 is inverted by the inverter I8 when an output of the inverter I3 is a high level and an output of the inverter I4 is a low level. An output of the inverter I8 is latched in a latch circuit 500 when the output of the inverter I3 is a low level and the output of the inverter I4 is a high level. The outputs of the latch circuit 500 and the inverter I3 are logically combined by a NOR gate G1. An output of the NOR gate G1 is set to a low level regardless of the output of the latch circuit 500 when the output of the inverter I3 is a high level. The output of the NOR gate G1 is inverted by the inverter I5.

In the main row decoder of a conventional art, the main word line is toggled by activation or precharging even when a sub word line connected to the main word line selected by the main row decoder is selected.

As illustrated in FIG. 6, when the sub word line is selected by a row address Ax<j>, the main word line MWLB is iteratively active and precharged every change of an output Bax_j of the row pre-decoder nevertheless of the coding pattern of the sub word lines. Thus, it increases power consumption.

SUMMARY OF THE INVENTION

Therefore, the present invention is directed to solve the aforementioned problem, providing a main row decoder of a semiconductor memory device in which a main word line is active or precharged only when the least significant bit of the main low decoder changes.

According to an aspect of the present invention, there is provided a main row decoder of a semiconductor memory device including: a bank controller for generating an internal RAS signal in response to an active and precharge signal; a first pulse generator for generating a first pulse signal when the internal RAS signal transitions; a second pulse generator for generating a second pulse signal when the internal RAS signal or a self refresh signal transitions; an address latch circuit for latching the least significant bit of a row address in response to the first pulse signal; and a row pre-decoder for decoding outputs of the address latch circuit in response to the second pulse signal.

BRIEF DESCRIPTION OF THE DRAWINGS

A more complete understanding of the present invention may be had by reference to the following description when taken in conjunction with the accompanying drawings in which.

DESCRIPTION OF THE PREFERRED EMBODIMENT

Figure 1:
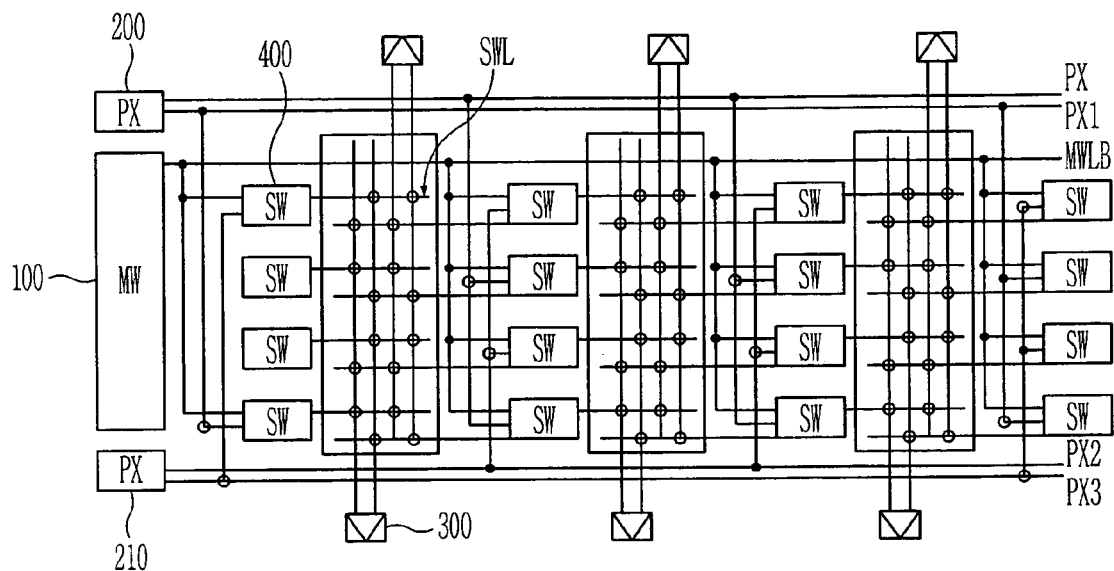
FIG. 1 is a schematic diagram illustrating a hierarchical word line structure of a conventional art.
Figure 2:
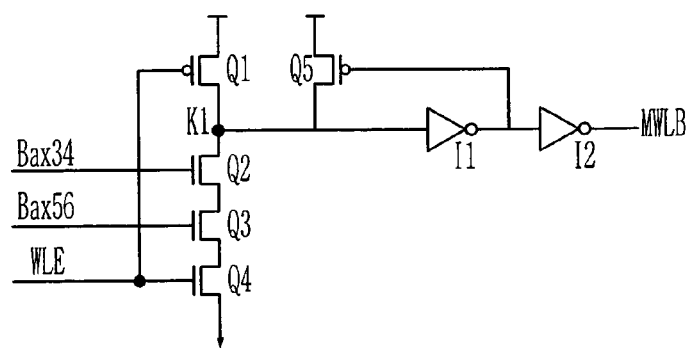
FIG. 2 is a circuit diagram of a main word line driver shown in FIG. 1.
Figure 3:
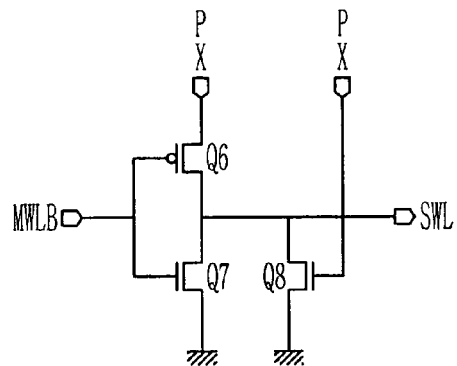
FIG. 3 is a circuit diagram of a sub word line driver shown in FIG. 1.
Figure 4:
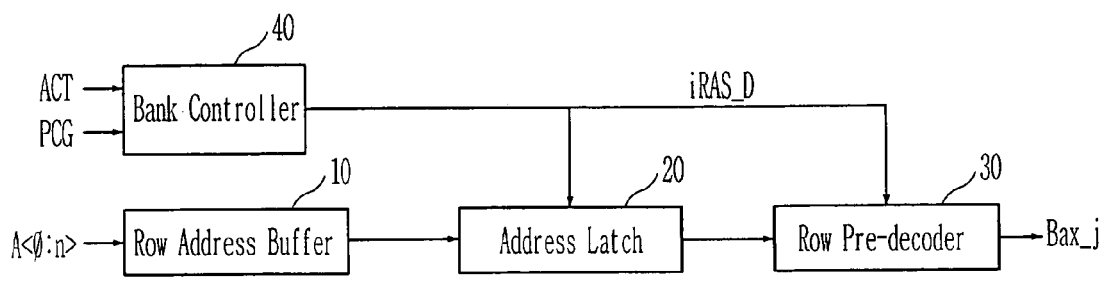
FIG. 4 is a block diagram of a conventional main row decoder.
Figure 5:
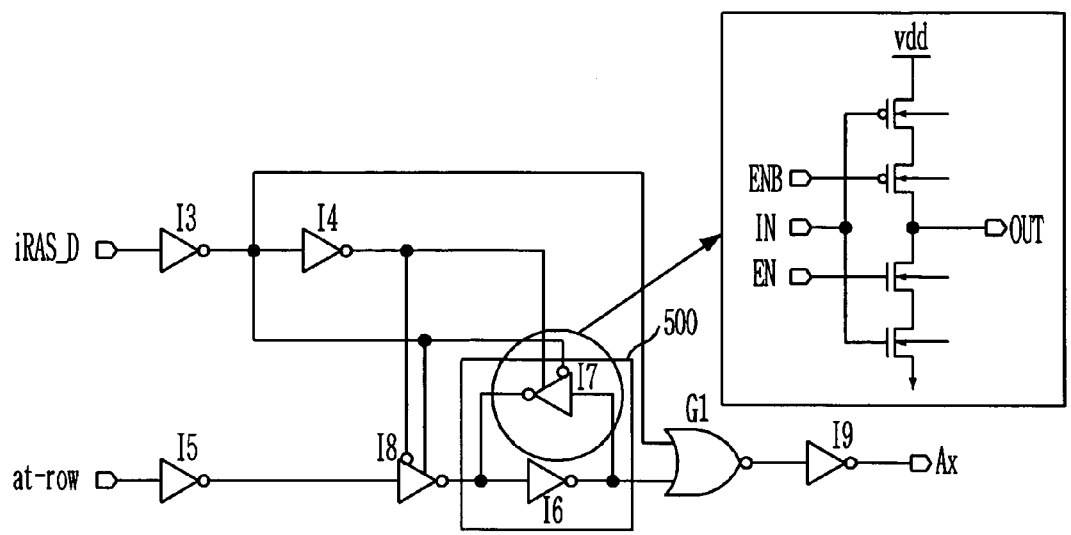
FIG. 5 is a circuit diagram of an address latch circuit shown in FIG. 4.
Figure 6:
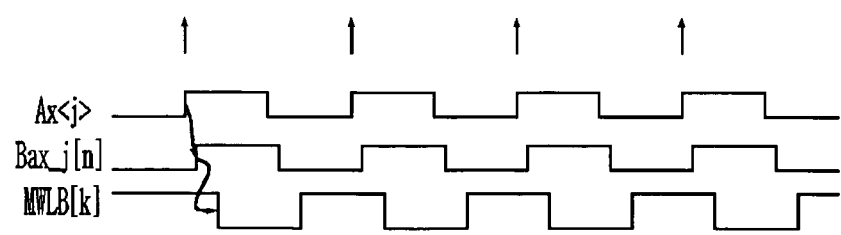
FIG. 6 is a timing diagram illustrating a procedure of selecting the main word line in a conventional art.

Referring now to the drawings wherein like or similar elements are designated with identical reference numerals throughout the several views and wherein various elements depicted are not necessarily drawn to scale.

Figure 7:
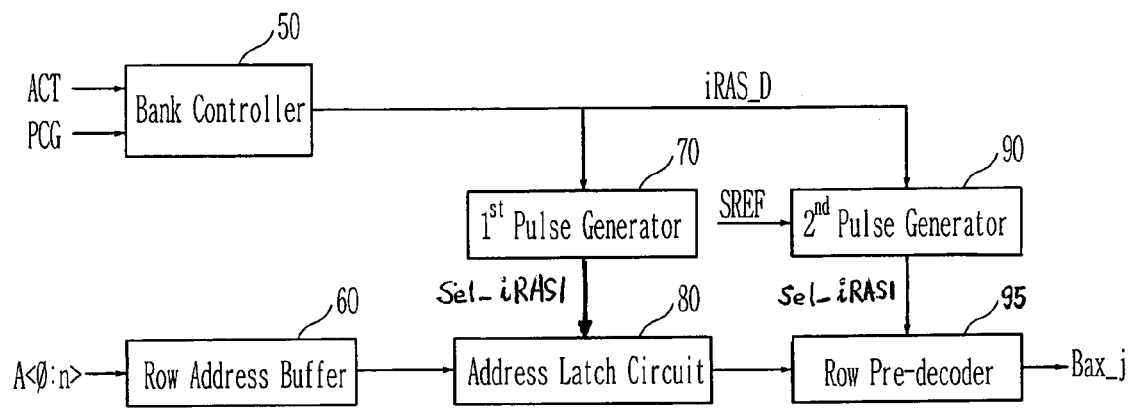
FIG. 7 is a block diagram of a main row decoder according to the present invention.

FIG. 7 is a block diagram of a main row decoder according to the present invention.

The address <0:n> is input to a row address buffer 60. According to the active signal ACT and the precharge signal PCG, the internal RAS signal iRAS_D is generated from the bank controller 50. Whenever the internal RAS signal IRAS_D transitions, a pulse signal Sel_iRAS1 is generated from a first pulse generator 70. Whenever the internal RAS signal iRAS_D or the self refresh signal SREF transitions, a pulse signal Sel_iRAS2 is generated from a second pulse generator 90. An output of the row address buffer 60 is latched in an address latch circuit 80 by the pulse signal Sel_iRAS1. An output of the address latch circuit 80 is pre-decoded in a row pre-decoder 95 by the pulse signal Sel_iRAS2. The main word line is enabled in response to an output Bax_j of the row pre-decoder 95.

Figure 8:
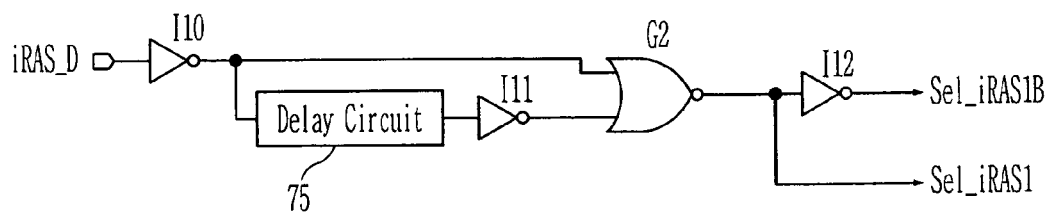
FIG. 8 is a circuit diagram of the first pulse generator shown in FIG. 7.

FIG. 8 is a circuit diagram of the first pulse generator shown in FIG. 7.

The internal RAS signal iRAS_D is inverted by an inverter I10. An output of the inverter I10 is delayed in a delay circuit 75. An output of the delay circuit 75 is inverted by an inverter I11. Outputs of the inverters I10 and I11 are input to a NOR gate G2. An output of the NOR gate G2 is the pulse signal Sel_iRAS1 and an inverted signal Sel_iRAS1B inverted by an inverter I12.

The first pulse generator 70 generates a pulse whenever the internal RAS signal changes. That is, if the output of the inverter I10 is a high level, the output of the NOR gate G2 becomes a low level. And then the output of the inverter I10 changes to a low level, the output of the NOR gate G2 becomes a high level because the outputs of the inverters I10 and I11 are low levels, in here, the outputs of the inverter I11 maintains in low level during a predetermined delay time according to the delay circuit 75, while the output of the inverter I12 is a low level.

Figure 9:
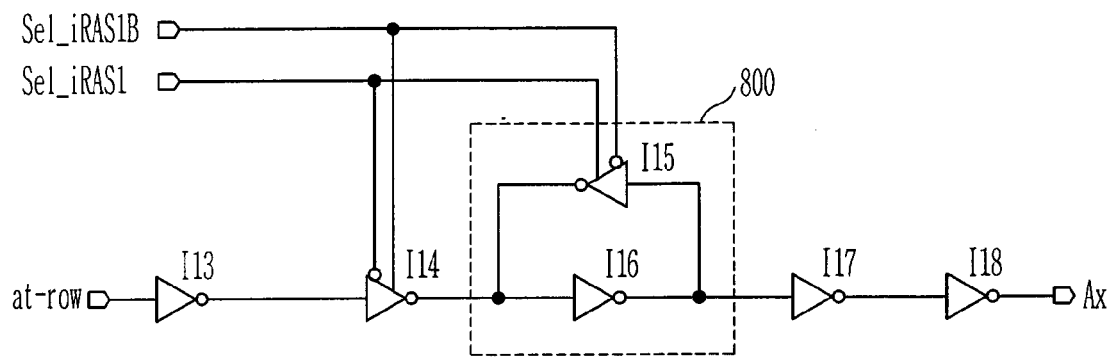
FIG. 9 is a circuit diagram of an address latch circuit shown in FIG. 7.

FIG. 9 is a circuit diagram of an address latch circuit shown in FIG. 7. An output signal at-row of the row address buffer 60 is inverted by an inverter I13. An output of the inverter I13 is inverted by an inverter I14 when the pulse signal Sel_iRAS1 is a high level and an inverted signal of the pulse signal, Sel_iRAS1B, is a low level. An output of the inverter I14 is latched in the latch circuit 800 when the pulse signal Sel_iRAS1 is a low level and the inverted signal of the pulse signal, Sel_iRAS1B, is a high level. An output of the latch 800 is transferred to an output Ax through inverters I17 and I18. The output Ax of the inverter I8 is input to the row pre-decoder 95 of FIG. 7.

In the conventional address latch circuit, a main word line has been activated or precharged in response to the active signal or the precharge signal even when a sub word line was coded. But, in the address latch circuit of the present invention, even when the active signal or the precharge signal is enabled with the coded sub word line, the least significant bit of a row address stored in the latch circuit is provided to the row pre-decoder and a main word line retains its previous state. In other words, the main word line is activated or precharged only when the least significant bit stored in the latch circuit 800 changes.

Figure 10:
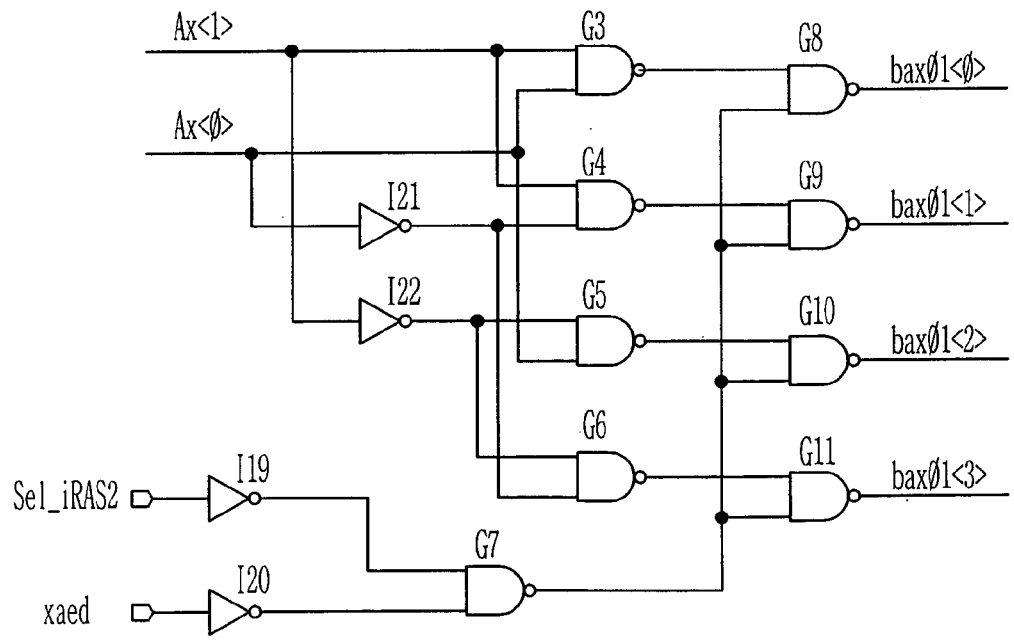
FIG. 10 is a circuit diagram of a row pre-decoder shown in FIG. 7.

FIG. 10 is a circuit diagram of a row pre-decoder shown in FIG. 7.

The output of the address latch circuit 80, e.g., Ax<0> and Ax<1>, are decoded by NAND gates G3 to G6. The address Ax<1> is input to the NAND gates G3 and G4, and to the NAND gates G5 to G6 through an inverter I22. The address Ax<0> is input to the NAND gates G3 and G5, and to the NAND gate G4 and g6 through an inverter I21. If the pulse signal Sel_iRAS2 or a row address enable signal xaed is a high level, outputs of inverters I19 and I20 are low levels to make an output of a NAND gate G7 be a high level. Accordingly, the outputs of the NAND gates G3 to G6 are inverted by NAND gates G8 to G11, respectively. The outputs of the NAND gates G8 to G11 become bank addresses bax01<0> to bax01<3> that select the main word line.

Figure 11:
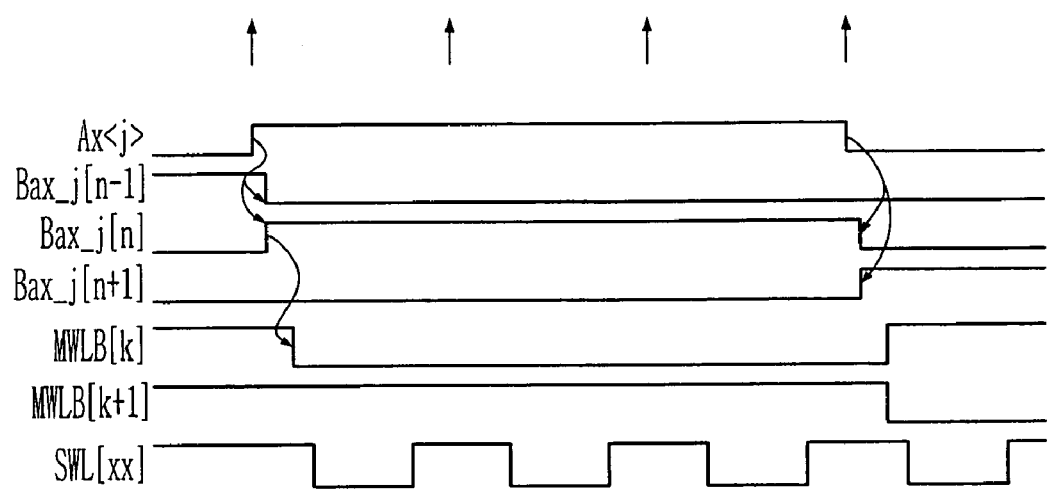
FIG. 11 is a timing diagram illustrating a procedure of selecting the sub word line in accordance with the present invention.

FIG. 11 is a timing diagram illustrating a procedure of selecting the sub word line in accordance with the present invention.

When the least significant bit (LSB) of the row address Ax<j> transitions to a high level from a low level, the high level of the LSB is latched in the address latch circuit 80. An output of the row pre-decoder 95, Bax-j[n−1], transitions from a high level to a low level. An output of the row pre-decoder 95, Bax-j[n], transitions from a low level to a high level. An output of the row pre-decoder 95, Bax-j[n+1], maintains a low level. Therefore, a main word line MWLB [k] transitions to a low level from a high level, a main word line MWLB[k+1] retains a high level. Thus, the sub word line SWL is enabled every in response to the active signal ACT.

When the LSB of the row address Ax<j> stored in the address latch circuit 80 changes (e.g., from a high level to a low level), the high level of the LSB is latched in the address latch circuit 80. The output of the row pre-decoder 95, Bax-j[n−1], maintains a low level. The output of the row pre-decoder 95, Bax-j[n], transitions from a high level to a low level. The output of the row pre-decoder 95, Bax-j[n+1], transitions from a low level to a high level. Thus, the main word line MWLB[k] transitions from a low level to a high level while the main word line MWLB[k+1] transitions from a high level to a low level. As the main word line toggles only when the LSB of the row address changes, it reduces Vpp current consumption for charging and discharging the capacitance of the main word line.

A current consumed for activating and precharging a main word line by Vpp is I=C (the capacitance of main word line)×Vpp/t.

For instance, the current consumed for enabling word lines of eight sub word line drivers in sequence will be evaluated as follows.

A conventional case values the current I=8 (the number of sub word lines)×2 (active and precharge)×i (the current for activating and precharging the main word line by Vpp).

On the other side, the present invention consumes the current I=1×2 (the first active and the last precharge)×i (the current for activating and precharging the main word line by Vpp).

Consequently, the present invention reduces the consumption of current to ⅛ rather than the conventional case.

As described above, since a main word line toggles only when the LSB of a row address transitions, it can reduce a Vpp consumption current for charging and discharging the capacitance of the main word line.

Furthermore, the present invention is more efficient for enabling word lines in sequence in order to refresh all memory cells in a predetermined time.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A main row decoder of a semiconductor memory device, comprising:
   a bank controller for generating an internal RAS signal in response to an active and precharge signal;
   a first pulse generator for generating a first pulse signal when the internal RAS signal transitions;
   a second pulse generator for generating a second pulse signal when the internal RAS signal or a self refresh signal transitions;
   an address latch circuit for latching the least significant bit of a row address in response to the first pulse signal; and
   a row pre-decoder for decoding outputs of the address latch circuit in response to the second pulse signal.

2. The main row decoder of claim 1, wherein the first pulse generator includes a detecting circuit for detecting a transition of the internal RAS signal and a pulse generating circuit for outputting the first pulse signal in response to an output of the detecting circuit.

3. The main row decoder of claim 1, wherein the address latch circuit comprises:
   a first inverter for inverting the row address;
   a second inverter for inverting an output of the first inverter in response to the first pulse signal; and
   a latch for latching an output of the second inverter.

4. The main row decoder of claim 3 further comprising;
   a third inverter for inverting an output of the latch; and
   a fourth inverter for inverting an output of the third inverter.

5. The main row decoder of claim 3, wherein the latch comprises:
   a fifth inverter for inverting the output of the second inverter; and
   a sixth inverter for inverting an output of the fifth inverter, wherein an output terminal of the sixth inverter is connected to an input terminal of the fifth inverter.

6. The main row decoder of claim 1, wherein the row pre-decoder comprises:
   a decoder for decoding an output of the address latch circuit;
   a controller for generating a control signal in response to the second pulse signal or an row address enable signal; and
   an output circuit for inverting an output of the decoder in response to an output of the controller.

7. The main row decoder of claim 2 further comprising an inverter for generating an inverted signal of the first pulse signal.

8. The main row decoder of claim 2, wherein the circuit comprises:
   a first inverter for inverting the internal RAS signal;
   a delay circuit for delaying an output of the first inverter;
   a second inverter for inverting an output of the delay circuit; and
   a NOR gate to logically combine outputs of the first and second inverters.

* * * * *